US009722337B2

United States Patent
(12) United States Patent
Kartheininger

(10) Patent No.: US 9,722,337 B2
(45) Date of Patent: Aug. 1, 2017

(54) ASSEMBLY FOR A COMPUTER SYSTEM AND ANGLE PLUG

(71) Applicant: Fujitsu Technology Solutions Intellectual Property GmbH, München (DE)

(72) Inventor: Michael Kartheininger, Augsburg (DE)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/655,072

(22) PCT Filed: Jul. 22, 2014

(86) PCT No.: PCT/EP2014/065751
§ 371 (c)(1),
(2) Date: Jun. 24, 2015

(87) PCT Pub. No.: WO2015/014675
PCT Pub. Date: Feb. 5, 2015

(65) Prior Publication Data

US 2016/0211596 A1 Jul. 21, 2016

(30) Foreign Application Priority Data

Aug. 2, 2013 (DE) ........................ 10 2013 108 363

(51) Int. Cl.
*H05K 7/00* (2006.01)
*H01R 12/70* (2011.01)
(Continued)

(52) U.S. Cl.
CPC ......... *H01R 12/7088* (2013.01); *G06F 1/188* (2013.01); *H01R 12/724* (2013.01); *H05K 7/1488* (2013.01); *H05K 7/1492* (2013.01)

(58) Field of Classification Search
None
See application file for complete search history.

(56) References Cited

U.S. PATENT DOCUMENTS 4,840,570 A * 6/1989 Mann, Jr. ........... H01R 12/7005 361/787
5,679,007 A * 10/1997 Potdevin ............. G06K 7/0021 439/76.1

(Continued)

FOREIGN PATENT DOCUMENTS

DE 44 20 537 A1 12/1995
DE 20 2008 003 769 U1 5/2008

(Continued)

*Primary Examiner* — Courtney Smith
*Assistant Examiner* — Rashen E Morrison
(74) *Attorney, Agent, or Firm* — Fujitsu Patent Center

(57) ABSTRACT

An assembly for a computer system includes an insert housing with a housing floor; a power supply unit arranged on the housing floor and having a plug contact; a main circuit board arranged within the insert housing substantially parallel to the housing floor; and an angle plug having a mating plug contact and a connection region for connection of the power supply unit to the main circuit board, wherein the angle plug, when connected to the main circuit board via the connection region, connects to a top face of the main circuit board at a first installation height of the main circuit board and connects to a bottom face of the main circuit board at a second installation height of the main circuit board so that height compensation with respect to the plug contact of the power supply unit is established in each case.

11 Claims, 2 Drawing Sheets

(51) Int. Cl.

| | |
|---|---|
| ***G06F 1/18*** | (2006.01) |
| ***H01R 12/72*** | (2011.01) |
| ***H05K 7/14*** | (2006.01) |

(56) References Cited

U.S. PATENT DOCUMENTS 7,101,188 B1 * 9/2006 Summers ............. H01R 12/725 439/59
7,445,493 B2 * 11/2008 Takahira ................ H01R 12/79 439/495
8,177,564 B1 * 5/2012 Ito ...................... H01R 13/6471 439/108
8,545,234 B2 * 10/2013 Szczesny ............... G02B 6/428 439/62
9,313,913 B2 * 4/2016 Jimenez, III ......... H05K 7/1418
2006/0221559 A1 * 10/2006 Campini .............. H05K 7/1461 361/679.36

FOREIGN PATENT DOCUMENTS

JP 01-62685 U 3/1989
JP 2008-198441 A 8/2008

* cited by examiner

A0
WS
L
AB
GK
ER
SK
OS
HP
EH1
A2
A1
US
KB
S
L
GB

A0
ER
WS
S
KB
GK
L
SK
OS
HP
A1
A2
US
GB
L
AB
EH2

ASSEMBLY FOR A COMPUTER SYSTEM AND ANGLE PLUG

TECHNICAL FIELD

This disclosure relates to an assembly for a computer system, which assembly has a housing with a housing floor, a power supply unit and a main circuit board. The disclosure further relates to an angle plug for use in an assembly of this kind.

BACKGROUND

A main circuit board of a server insert usually electrically connects to a power supply unit to be supplied with power. In this case, the power supply unit (PSU) generally connects to the main circuit board in a connection region of the main circuit board. The power supply unit preferably connects to the main circuit board by direct plug-connection.

It could nonetheless be helpful to provide an assembly for a server insert of a server system, and also an apparatus, which permit easy-to-establish electrical connection of a power supply unit to a main circuit board.

SUMMARY

I provide an assembly for a computer system including an insert housing with a housing floor; a power supply unit arranged on the housing floor and having a plug contact; a main circuit board arranged within the insert housing substantially parallel to the housing floor; and an angle plug having a mating plug contact and a connection region for connection of the power supply unit to the main circuit board, wherein the angle plug, when connected to the main circuit board via the connection region, connects to a top face of the main circuit board at a first installation height of the main circuit board and connects to a bottom face of the main circuit board at a second installation height of the main circuit board so that height compensation with respect to the plug contact of the power supply unit us established in each case.

I also provide an angle plug for use in the assembly for a computer system including an insert housing with a housing floor; a power supply unit arranged on the housing floor and having a plug contact; a main circuit board arranged within the insert housing substantially parallel to the housing floor; and an angle plug having a mating plug contact and a connection region for connection of the power supply unit to the main circuit board, wherein the angle plug, when connected to the main circuit board via the connection region, connects to a top face of the main circuit board at a first installation height of the main circuit board and connects to a bottom face of the main circuit board at a second installation height of the main circuit board so that height compensation with respect to the plug contact of the power supply unit us established in each case, including a connection region for connection to a main circuit board and having a mating plug contact for connection to a plug contact of a power supply unit, wherein the angle plug establishes height compensation between the plug contact of the power supply unit and the main circuit board in an installed state within a computer system.

LIST OF REFERENCE SYMBOLS

Figure 1:
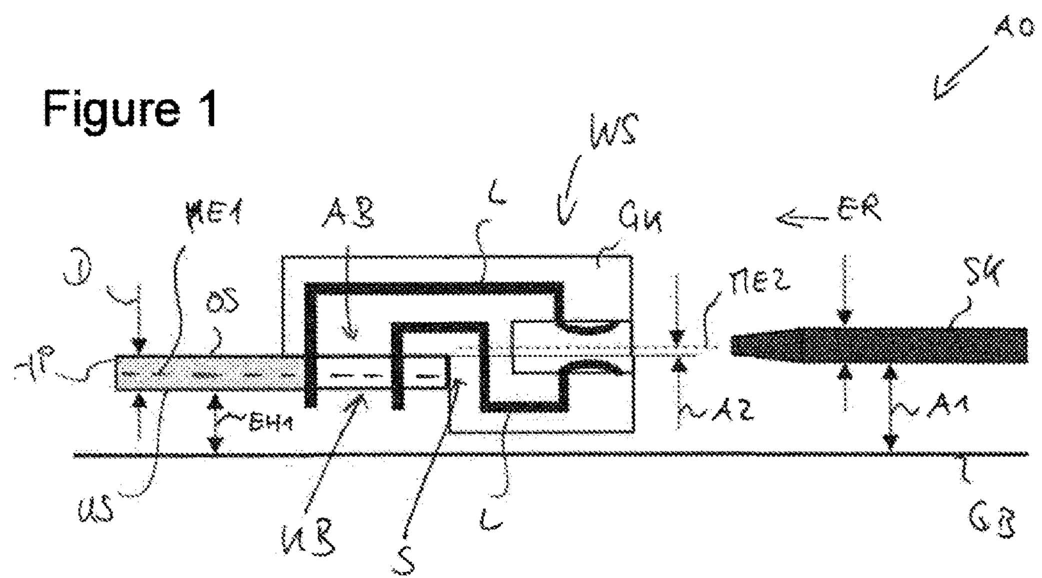
FIG. 1 shows a schematic sectional view through an assembly for a server insert comprising a main circuit board at a first installation height.

A1 First distance
A2 Second distance
AB Connection region
AO Assembly
D Thickness
EH1 First installation height
EH2 Second installation height
ER Insertion direction
GB Housing floor
GK Main body
GS Mating plug contact
HP Main circuit board
KB Contact region
L Line
ME1 First center plane
ME2 Second center plane
NT Power supply unit
OS Top face
S Step
SE Plane of symmetry
SK Plug contact
US Bottom face
WS Angle plug

DETAILED DESCRIPTION

I provide an assembly for a server insert of a server system, which assembly has an insert housing with a housing floor. A power supply unit having a plug contact is arranged on the housing floor. A main circuit board is arranged within the insert housing parallel to the housing floor. In addition, the assembly has an angle plug which has, for connection of the power supply unit to the main circuit board, a mating plug contact and a connection region, wherein the angle plug, when connected to the main circuit board by way of the connection region, connects to a top face of the main circuit board at a first installation height of the main circuit board and connects to a bottom face of the main circuit board at a second installation height of the main circuit board so that height compensation with respect to the plug contact of the power supply unit is established in each case.

Insert housings for server inserts generally have a housing height of one or two height units (HE for short, also unit or U for short in English) and, therefore, have firmly defined dimensions. The power supply units generally have a firmly prescribed shape factor and are generally arranged in a fixed installation position in the insert housing. This means that the plug contact of the power supply unit is substantially always at a constant distance from the housing floor of the insert housing.

Depending on the respective server system, different components such as riser cards or other plug-in cards, for example, are arranged in the interior of the insert housing. As a result, the main circuit boards in the respective server systems are at different distances from the housing floors. The main circuit boards are also at different distances from the housing floor on account of other mechanical restrictions, for example, due to fastenings of slot angles of the plug-in cards in a slot area of the insert housing. As a result, it is not readily possible to connect the power supply unit, of which the plug contact is generally at the constant distance from the housing floor, to main circuit boards which are at different distances from the housing floor by direct plug-connection.

The assembly may thus make provision for the power supply unit to be plug-connected directly to the main circuit board by an angle plug. Depending on a first installation height and a second installation height, the angle plug can connect either to the top face or the bottom face of the main circuit board by way of the connection region so that height compensation in relation to the plug contact of the power supply unit is established. The angle plug can, therefore, connect to the bottom or top face of the main circuit board with a different orientation, essentially rotated through 180°. It is therefore possible to plug-connect one and the same power supply unit directly to a main circuit board which can be arranged within the insert housing at a first or second installation height with respect to the housing floor. To this end, the angle plug has an offset between the connection region and the mating plug contact, the angle plug compensating for an offset between the main circuit board and the plug contact of the power supply unit by way of the offset.

The installation height is understood to be essentially the distance in the normal direction of a plane of extent of the main circuit board from the housing floor. In this case, the installation height does not necessarily have to assume a specific value but rather can comprise a narrow tolerance range of, for example, up to 1 mm.

It is therefore not necessary to provide separate plug connections for the different server systems and main circuit boards with different installation heights. In addition, cables and/or separate intermediate boards can be avoided. Furthermore, an assembly of this kind is suitable for so-called "hot-plugging." Hot-plugging is the ability to exchange or replace installation or insert components during ongoing operation of a (server) system. Therefore, component variants for the direct plug-connection of the power supply units can be reduced with the aid of the angle plug. This leads to simple logistics and low unit prices since the angle plugs can be produced in large quantities.

In other words, the angle plug compensates for an offset between a first center plane of the main circuit board and a second center plane of the plug contact of the power supply unit such that the plug contact of the power supply unit can be received in the mating plug contact of the angle plug independently of the first installation height or the second installation height of the main circuit board. Therefore, the angle plug compensates for different plug or connection levels between the power supply unit and the main circuit board at two installation heights of the main circuit board.

In other words, a surface which, parallel to a first center plane of the main circuit board, faces the connection region in the inserted state of the angle plug is at a substantially constant distance from a second center plane of the plug contact of the power supply unit, which second center plane runs parallel to the first center plane.

The main circuit board may have, for connection of the angle plug, a contact region, in particular metalized openings, it being possible for the connection region of the angle plug to make electrical contact with the contact region at the top face and at the bottom face of the main circuit board. The fitting costs are also reduced as a result since the angle plug can be fitted in a simple manner and without tools.

The connection region of the angle plug may have, for connection to the main circuit board, press-in contacts, in particular press-fit contacts. The press-in contacts can be inserted into the contact region, for example, into the metallized openings of the main circuit board in a particularly simple manner. This is possible both from a top face and from the bottom face of the main circuit board. A wave soldering process that solders wire contacts or connections is dispensed with due to through-hole technology (THT for short) through contact holes by virtue of using press-in contacts, in particular press-fit contacts. In particular, if the wire contacts were inserted into the main circuit board from the bottom face, it would be possible to implement wave soldering of the top face of the motherboard only using complicated means and, therefore, at very high costs. However, press-in contacts are simple to produce and easy to fit since the angle plug can be fitted in a simple manner and without tools. The press-in contacts do not have to be soldered in an additional fitting step, as a result of which time and costs are saved.

The mating plug contact of the angle plug may have, to receive the plug contact of the power supply unit, spring contacts, in particular a spring contact strip. This provides a simple possible way of connecting the power supply unit directly to the angle plug. Due to the provision of spring contacts, it is possible to compensate for manufacturing tolerances and, as described in the introduction, to compensate for tolerances in the installation height of the main circuit board. This is because the spring contacts always establish contact with the plug contact of the power supply unit in accordance with their spring force in a tolerance range.

The plug contact of the power supply unit may have at least one contact tongue, in particular a gold contact tongue. This provides a simple refinement of the plug contact which is suitable, in particular, for direct plug-connection and, therefore, for hot-plugging.

The angle plug may be of mirror-symmetrical design. As a result, it is possible for the power supply unit to be able to be correctly connected to the top or bottom face of the main circuit board by way of its plug contact independently of the orientation of the angle plug. This means that, for example, the correct contacts or pins of the power supply unit always connect to the corresponding contacts or conductor tracks of the main circuit board which are provided for the contacts or pins of the power supply unit.

I also provide an angle plug for use in an assembly.

Further examples are disclosed in the following, detailed description of a representative construction.

Figure 2:
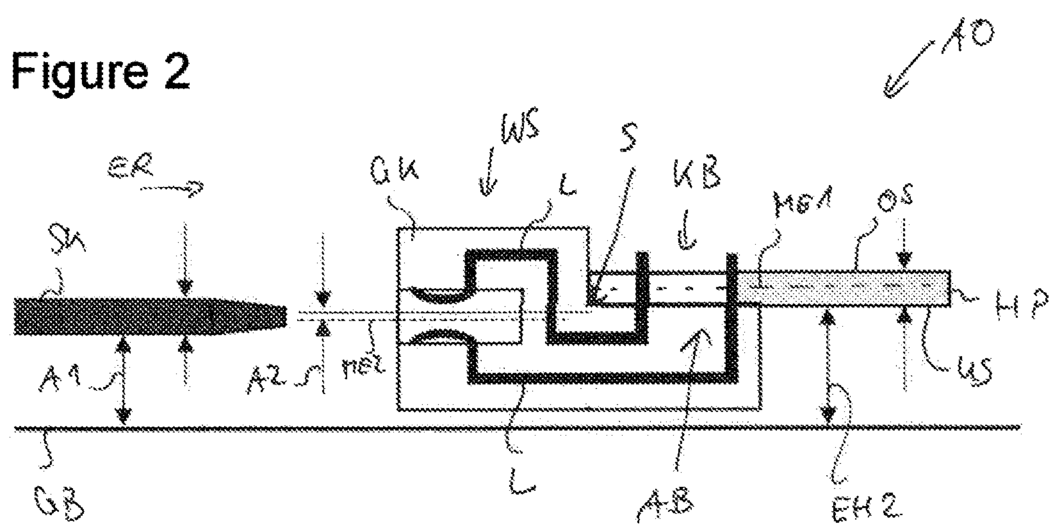
FIG. 2 shows a schematic sectional view through an assembly for a server insert comprising a main circuit board at a second installation height.
Figure 3:
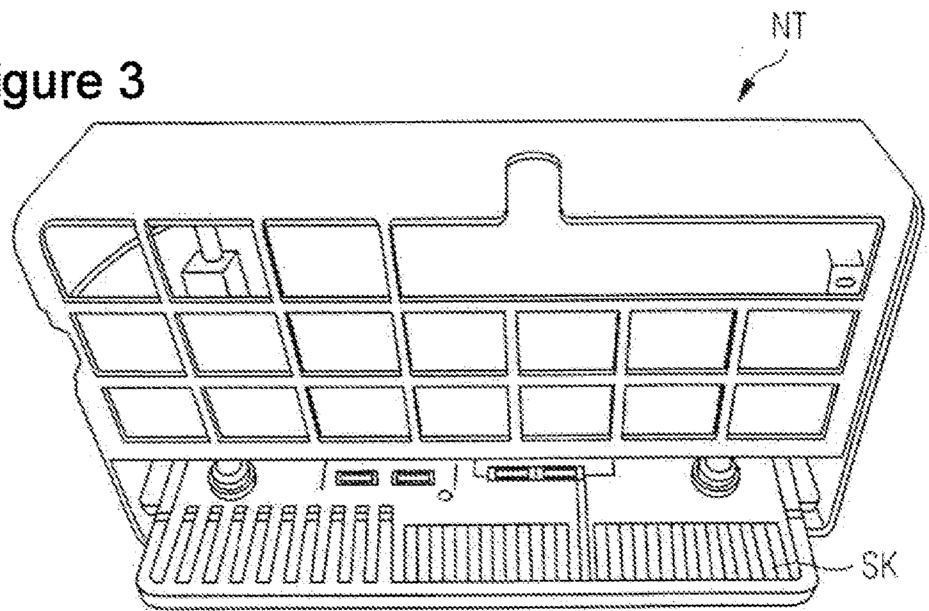
FIG. 3 shows a perspective view of a power supply unit.

FIGS. 1 and 2 show schematic sections through assemblies AO for a server insert of a server system. The assemblies AO each have a housing floor GB of an insert housing. The assemblies AO further have an angle plug WS, a structural refinement of the angle plug being illustrated in perspective in FIG. 4. The assemblies AO further have a power supply unit NT, by way of example of the design shown in FIG. 3, with a plug contact SK which is a contact tongue such as a gold contact tongue, for example. Other structural refinements for the power supply unit NT and the angle plug WS are possible.

In the assemblies AO, a main circuit board HP is installed with respect to the housing floor GB at a first installation height EH1 as shown in FIG. 1 and at a second installation height EH2 as shown in FIG. 2. Installation heights EH1 and EH2 mean a distance of a bottom face US of the main circuit board HP from the housing floor GB in a normal direction to a plane of extent of the housing floor GB.

Figure 4:
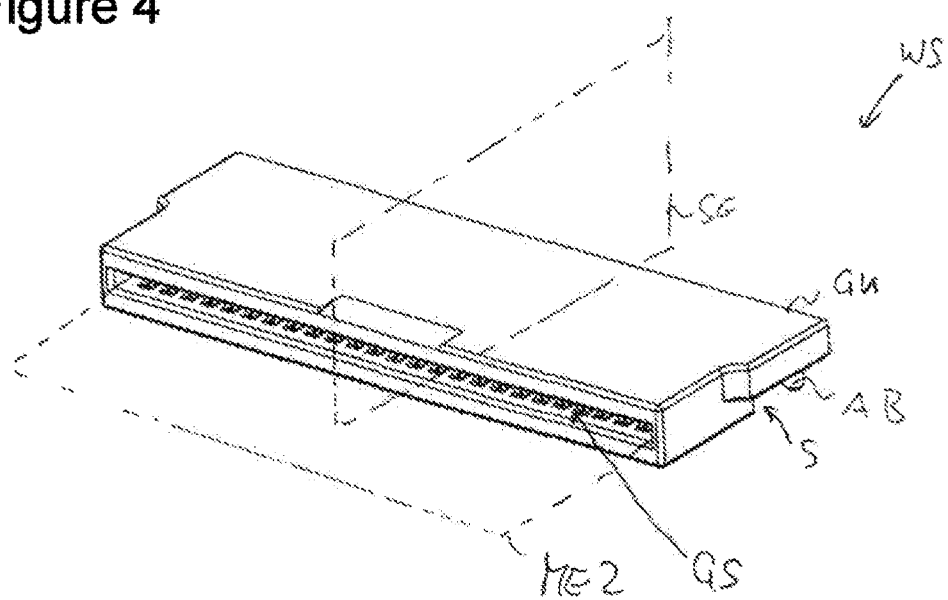
FIG. 4 shows a perspective view of an angle plug.

The angle plug WS has a main body GK which has, on a first face, a mating plug contact GS, as illustrated in FIG. 4, for connection to the plug contact SK of the power supply unit NT. The mating plug contact GS is designed as a spring contact strip which has a plurality of spring contacts that receive the contact tongue of the power supply unit NT. The angle plug WS further has, on a second face of the main body, a connection region AB. Press-in contacts, in particular press-fit contacts, are arranged in the connection region AB. The press-fit contacts and the spring contacts electrically connect via lines L in the interior of the main body GK. Further details of the electrical connection in the interior of the angle plug WS are not illustrated.

The main circuit board HP has, for connection of the angle plug WS, a contact region KB in which metallized openings are arranged. In this case, the openings are continuously made in the main circuit board HP over a thickness D of the main circuit board HP. It is therefore possible for the angle plug WS to be able to connect and/or plug-connect both to a top face OS (see FIG. 1) and also to the bottom face US (see FIG. 2) of the main circuit board HP by way of the connection region AB.

As mentioned in the introduction, the power supply unit NT has a generally firmly defined shape factor and is arranged in the server insert such that the plug contact SK is at a fixed first distance A1 from the housing floor GB of the server insert. Therefore, the plug contact SK in the assemblies AO according to FIGS. 1 and 2 is at a substantially identical first distance A1, for example, 4.3 mm, from the housing floor GB, which distance is defined analogously to the installation heights EH1 and EH2.

The different installation heights EH1 and EH2 of the main circuit boards HP according to FIGS. 1 and 2 can result from the mechanical restrictions as described in the introductory part. The first installation height EH1 can be, for example, a distance from the housing floor GB of 3 mm. The second installation height EH2 can be, for example, a distance from the housing floor of 5.6 mm. There is therefore an offset between a first center plane ME1 of the main circuit board HP and a second center plane ME2 of the plug contact SK of the power supply unit NT in both assemblies AO of FIGS. 1 and 2. Therefore, the contact region KB of the main circuit board HP and the plug contact SK of the power supply unit NT have a different plugging level.

The offset between the first center plane ME1 and the second center plane ME2 is now compensated for by the angle plug WS. In this case, the angle plug WS according to FIG. 1 connects to the top face OS of the main circuit board HP in the contact region KB by way of the connection region AB. In this case, the mating plug contact GS of the angle plug WS is arranged substantially such that the offset between the two center planes ME1 and ME2 has been compensated for and the plug contact SK can be received in the mating plug contact GS or the mating plug contact can make contact with the plug contact. Analogously to this, the angle plug WS connects to the bottom face US of the main circuit board HP according to FIG. 2.

The angle plug WS therefore establishes height compensation with respect to the plug contact SK of the power supply unit NT for both installation heights EH1 and EH2 of the main circuit board HP. In this case, the top face OS or the bottom face US of the main circuit board HP substantially remains at a constant distance A2 from the second center plane ME2 of the plug contact SK. In other words, that surface facing the connection region AB of the angle plug in the inserted state and runs parallel to the first center plane ME1 of the main circuit board HP remains at the constant distance A2 from the second center plane ME2. This is shown by FIGS. 1 and 2.

To implement or ensure correct contact-connection to the power supply unit NT by the main circuit board HP, the angle plug WS is of substantially mirror-symmetrical design with respect to a plane of symmetry SE, as illustrated by FIG. 4. In this case, the plane of symmetry SE is arranged perpendicular to the second center plane ME2 of the plug contact SK and perpendicular to the plugging direction of the power supply unit NT (illustrated in dashed lines in FIG. 4). As a result, it is possible for the angle plug WS to be able to connect both to the bottom face US and also to the top face OS of the main circuit board HP and to establish a correct electrical connection between the power supply unit NT and the main circuit board HP. In this case, correct means that lines, contacts or pins of the plug contact SK of the power supply unit NT are connected to the corresponding contacts, lines or pins of the main circuit board HP in the contact region KB by the angle plug WS.

The assembly AO makes it possible for the power supply unit NT to connect directly to the main circuit board HP by the plug contact SK. Therefore, the hot-plugging described in the introductory part is possible. In this case, only one angle plug WS has to be provided, independently of the first or second installation height EH1 or EH2. No further plug connectors have to be provided to prepare the different installation heights EH1 and EH2 of the main circuit board HP for direct connection to the power supply unit NT.

As shown in FIGS. 1 and 2, the main body GK is of stepped design with a step S. The step S is arranged on the main circuit board HP in an interlocking manner in the inserted state of the angle plug WS. As a result, it is possible for forces to be able to be received by the main circuit board HP in an insertion direction ER substantially parallel to the first center plane ME1 when the plug contact SK of the power supply unit NT is inserted into the mating plug contact GS of the angle plug WS so that the forces are not all transmitted to the connection region AB of the angle plug WS and to the contact region KB of the main circuit board HP.

The structural design of the angle plug WS and of the power supply unit NT and also the electrical connection between the connection region AB and the mating plug contact GS is to be understood merely as an example. Other structural designs are possible. According to FIG. 1, the angle plug WS compensates for the offset starting from the first center plane ME1 in a first direction upward to the second center plane ME2 of the plug contact SK. According to FIG. 2, this offset is compensated for in the downward direction starting from the first center plane ME1 in a second direction opposite to the first direction. According to an alternative, structural design of the angle plug WS, the two directions can also be interchanged.

The invention claimed is:

1. An assembly for a computer system comprising:

an insert housing with a housing floor;

a power supply unit arranged on the housing floor and having a plug contact;

a main circuit board arranged within the insert housing substantially parallel to the housing floor, the main circuit board comprises a top face and a bottom face; and an angle plug having a mating plug contact for receiving the plug contact of the power supply unit and a connection region for connection of the power supply unit to the main circuit board, wherein the power supply unit is plug-connected directly to the main circuit board by means of the angle in a first installation height or a second installation height of the main circuit board;

wherein the first installation height is a first distance in the normal direction of a plane of extent of the main circuit board from the housing floor and the second installation height is a second distance in the normal direction of the plane of extent of the main circuit board from the housing floor;

wherein the angle plug is configured to be, when connected to the main circuit board via the connection region, connected with the connection region to the top face of the main circuit board at the first installation height of the main circuit board when in a first orientation of the angle plug, wherein the angle plug is configured to be, when connected to the main circuit board via the connection region, connected to the bottom face of the main circuit board at the second installation height of the main circuit board when in a second orientation of the angle such that the angle is directly connected to the main circuit board and so that a different height compensation with respect to the plug contact of the power supply unit is established in each case, and wherein, in the second orientation, the angle is rotated 180° compared to the first orientation.

2. The assembly according to claim 1, wherein the main circuit board has, for connection of the angle plug, a contact region comprising metallized openings such that the connection region of the angle plug can electrically contact said contact region at the top face and at the bottom face of the main circuit board.

3. The assembly according to claim 1, wherein the connection region of the angle plug has, for connection to the main circuit board, press-in contacts or press-fit contacts.

4. The assembly according to claim 1, wherein the mating plug contact of the angle plug has, to receive the plug contact of the power supply unit, spring contacts or a spring contact strip.

5. The assembly according to claim 1, wherein the plug contact of the power supply unit has at least one contact tongue or a gold contact tongue.

6. The assembly according to claim 1, wherein the angle plug is mirror-symmetrical.

7. An angle plug for use in the assembly according to claim 1, wherein the angle plug establishes height compensation between the plug contact of the power supply unit and the main circuit board in an installed state within a computer system.

8. The assembly according to claim 1, wherein the plug contact of the power supply unit is at a constant distance from the housing floor of the insert housing.

9. The assembly according to claim 1, wherein the angle plug has an offset between the connection region and the mating plug contact, said angle plug compensating for an offset between the main circuit board and the plug contact of the power supply unit by way of said offset.

10. The assembly according to claim 1, wherein the plug contact of the power supply unit is at a constant distance from the housing floor of the insert housing, and wherein the power supply unit can be directly connected to the main circuit board via the angle plug independently from the installation height of the main circuit board.

11. The assembly according to claim 1, wherein the angle plug compensates for an offset between a first center plane of the main circuit board and a second center plane of the plug contact of the power supply unit in such a way that the plug contact of the power supply unit can be received in the mating plug contact of the angle plug independently of the first installation height or the second installation height of the main circuit board.

* * * * *